United States Patent [19]

Cline

[11] Patent Number: 4,498,923

[45] Date of Patent: Feb. 12, 1985

[54] METHOD FOR PRODUCING EUTECTICS AS THIN FILMS USING A QUARTZ LAMP AS A HEAT SOURCE IN A LINE HEATER

[75] Inventor: Harvey E. Cline, Schenectady, N.Y.

[73] Assignee: General Electric Company, Schenectady, N.Y.

[21] Appl. No.: 557,996

[22] Filed: Dec. 5, 1983

Related U.S. Application Data

[62] Division of Ser. No. 245,764, Mar. 20, 1981.

[51] Int. Cl.³ .................... C22B 61/00; C22B 9/00
[52] U.S. Cl. .................... 75/65 ZM; 204/129.95; 204/130; 219/121 LM; 219/121 LF; 219/121 LE; 156/656; 350/1.7; 427/53.1
[58] Field of Search ............ 75/65 ZM; 156/634, 656, 156/627; 219/121 LE, 121 LF, 121 LM; 313/112; 204/129.1, 129.5, 129.85, 129.95, 130; 350/1.7, 162; 427/53

[56] References Cited

U.S. PATENT DOCUMENTS

| | | | |
|---|---|---|---|
| 3,484,153 | 12/1969 | Hunt et al. | 350/162 |
| 3,542,456 | 11/1970 | Kantor | 204/130 |
| 3,671,102 | 6/1972 | Clawson | 350/1.7 |
| 3,720,856 | 3/1973 | Brody | 313/309 |
| 4,015,100 | 3/1977 | Gnanamathy et al. | 219/121 LM |
| 4,100,044 | 7/1978 | Hussey et al. | 204/129.95 |
| 4,157,923 | 6/1979 | Yeu et al. | 219/121 LE |
| 4,209,008 | 6/1980 | Lemkey et al. | 156/656 |
| 4,349,621 | 9/1982 | Cline | 428/610 |

FOREIGN PATENT DOCUMENTS

| | | | |
|---|---|---|---|
| 55-117584 | 9/1980 | Japan | 219/121 LF |
| 1500208 | 2/1978 | United Kingdom | 427/53 |

OTHER PUBLICATIONS

Dhindaw, B. K. et al., *Conf. on In Situ Composites* III, 60–68, 1979.
Albers, W, et al., *J. Crystal Growth*, 18, 147–150, 1973.
Hauser, L. A. *The Iron Age*, 48–54, Jan. 20, 1944.

*Primary Examiner*—Veronica O'Keefe
*Attorney, Agent, or Firm*—Paul E. Rochford; James C. Davis, Jr.; James Magee, Jr.

[57] ABSTRACT

A method for the preparation of aligned eutectics as thin films is provided. The components of the eutectic are deposited in overlying planar layers on a suitable substrate to form a preform and a molten zone, having predetermined characteristics, is established and caused to traverse the preform melting and intermixing the deposited layers leaving the solidified thin film eutectic in its path.

4 Claims, 13 Drawing Figures

METHOD FOR PRODUCING EUTECTICS AS THIN FILMS USING A QUARTZ LAMP AS A HEAT SOURCE IN A LINE HEATER

CROSS-REFERENCE TO RELATED APPLICATION

This application is division of application Ser. No. 245,764 filed Mar. 20, 1981.

The invention herein is related to the invention disclosed and claimed in Ser. No. 253,985, filed Apr. 13, 1981 now U.S. Pat. No. 4,349,621 issued on Sept. 14, 1982, assigned to the same assignee as the instant application, and herein incorporated by reference in its entirety.

FIELD OF THE INVENTION

This invention relates broadly to the metallurgical arts and more particularly to a method for making aligned eutectic structures in the form of very thin films.

BACKGROUND OF THE INVENTION

Eutectics are phenomena of nature. A simple binary eutectic system is typified by the metallic alloys of lead and tin. Pure elemental tin exhibits an equilibrium freezing point of 232° C. and pure elemental lead exhibits an equilibrium freezing point of 327° C. With but one exception, alloys of tin and lead solidify and melt over a temperature range. The temperature at which a lead-tin alloy begins to solidify will be less than the freezing temperature of elemental lead and may also be less than the freezing temperature of elemental tin.

The exception referred to above is an alloy of 38.1 wt. % lead and 61.9 wt. % tin. This alloy is the alloy of the eutectic composition. The eutectic alloy will freeze, under equilibrium conditions, at the eutectic temperature of 183° C. Also, under equilibrium conditions, the solidification of lead-tin alloys of non-eutectic composition will be completed at the eutectic temperature.

Eutectics exhibit a variety of structures. Such terms as lamellar, plate-like, rod-like, discontinuous, and divorced are commonly used to describe the physical appearance of eutectics. The eutectic structure is dependent upon many factors including the components of the alloy system, the nature and quantity of any impurities present, and the rate at which they are formed. For example, the eutectic of an alloy system may exhibit a regular periodic array of lamellae, or plates, when solidified at near equilibrium rates. As the solidification rate increases, the width of the lamellae will generally decrease, the periodicity will generally become more irregular and individual lamella may terminate abruptly or branch into one or more lamella thus creating faults in the otherwise periodic uniform structure. At very rapid rates of solidification, the near-equilibrium lamellar structure may break down completely and form a new structure with a markedly different appearance.

Eutectics are found in metallic, ceramic, and organic systems and need not be formed from elements, i.e., combinations of compounds may form eutectics. Transparent organic eutectics having lamellar microstructures and the method of making them are described, for example, in U.S. Pat. No. 3,484,153 to Hunt and Jackson. A binary eutectic formed from two elements, or compounds, is the simplest eutectic and more complex eutectics, e.g. ternary and quaternary, are also observed.

Eutectics have many unique properties which make them candidates for many structural and non-structural applications. An example of the use of eutectics in a structural context is the report by Bruch et al. in the Proceedings of the Conference on In Situ Composites-III (Ginn Custom Publishing, p. 258, 1979), that the eutectic alloy NiTaC-13 has been directionally solidified in the form of jet engine turbine blades and successfully engine tested. The same Proceedings contain several papers on eutectics for nonstructural applications. The first paper in the series on nonstructural applications is the one at p. 171 by Yue which reviews the use of directionally solidified eutectics for electronic, magnetic, thermomagnetic, and superconducting applications.

Eutectics may be produced in bulk, as exemplified by the turbine blade discussed above, or in thinner sections for nonstructural applications or for academic purposes such as the study of solidification mechanics. Eutectics in bulk form have been grown under unidirectional cooling conditions by such means as the Bridgman, Czochralski, zone levelling or floating zone techniques.

Various techniques have been used previously to produce eutectics in thinner sections. Generally, the prior art techniques produced films that were poor in quality, e.g., were non-uniform in thickness, were not fault-free over large regions, and exhibited poor alignment of the lamellae relative to the lateral surfaces.

Albers and Van Hoof report, for example, (Journal of Crystal Growth, 18, p. 147, 1973) use of a modified Czochralski technique to produce films of the Cd-Zn eutectic. Those films were extracted from the melt by immersing a form, such as a wire loop, or a substrate into the melt and slowly withdrawing the form or substrate from the melt. The films of Albers and Van Hoof were not fault-free, appeared non-uniform in thickness, and exhibited an anomalous relationship between interlamellar spacing and pulling rate which is possibly indicative of non-uniform heat flow during the extraction process. Takahashi and Ashinuma (Jnl. of Inst. for Metals, 87, p. 19, 1958–59) used a technique similar to that of Albers and Van Hoof to produce thin films of the Pb-Sn eutectic. The Pb-Sn films produced by Takahashi and Ashinuma were irregular in thickness and were not fault-free over large areas, but were suitable for their purposes which was the study of the eutectic by means of the electron microscope.

Another technique for producing thin eutectic structures is that of Dhindaw et al., reported at page 60 of the above-referenced Proceedings, wherein lead-cadmium and lead-tin eutectic alloys were encapsulated in stainless steel or quartz capillaries. Dhindaw et al. report, inter alia, that as the distance between the walls of the capillary decreased, there was an increased tendency for the lamellae of the eutectics investigated to align perpendicular to the walls at the walls and to form parallel plates aligned perpendicular to the walls in the region between the walls. That behavior was attributed to a constraining effect at the walls. As the distance between the walls increased, the constraining effect at the walls reportedly became less effective in maintaining the perpendicular alignment of the lamellae at the walls resulting in the observed increased non-perpendicularity at the walls. That effect, in turn, caused the lamellae in the region between the walls to form at increased angles to the walls and to exhibit an increased tendency for fault formation.

BRIEF DESCRIPTION OF THE INVENTION

A method for the preparation of aligned eutectics as thin films is provided. Briefly described the method includes the steps of depositing sequentially the components of the eutectic alloy system as overlying thin planar layers on at least a portion of a substrate, which is inert relative to the eutectic alloy system, to form a preform; creating a molten zone which extends through the planar layers of the eutectic components and is contiguous with a portion of the top surface of the substrate; and moving the molten zone across at least a portion of the preform causing the components to melt at the leading edge of the zone, mix in the molten zone and solidify as the thin film eutectic at the trailing edge of the zone. Heat from a line heater or laser, preferably focused to form a line source of heat having a narrow width, is used to establish the molten zone.

Using the method of the invention and a focused line heater as the heat source, fault-free and cell-free lead-tin eutectic films as thin as 2 microns with interlamellar spacings as small as 1.8 microns have been produced. Also, using the method of the invention, and a focused laser as the heat source, fault-free and cell-free lead-tin eutectic films as thin as 2 microns with an interlamellar spacing of 0.45 microns and fault-free and cell-free lead-cadmium eutectic films as thin as 2 microns with interlamellar spacings as small as 0.1 micron have been produced.

DETAILED DESCRIPTION OF THE INVENTION AND THE PREFERRED EMBODIMENTS

Figure 1:
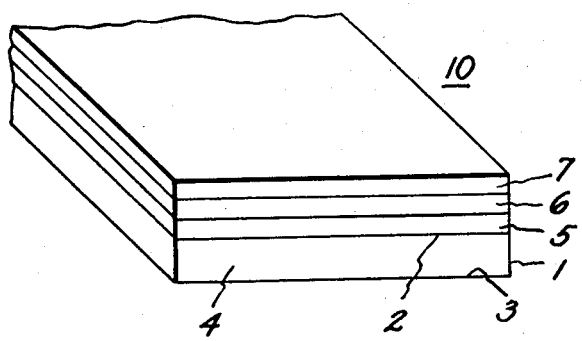
FIG. 1 is a schematic perspective representation of a typical preform.

With reference to the Figures, beginning with FIG. 1, the invention may be readily explained. Assuming selection of the system whose eutectic is to be prepared as a thin film by the method of this invention, the first step is the selection and preparation, if necessary, of substrate 1. The chief factors to be considered in the selection of a suitable substrate 1 are thermal conductivity and chemical inertness with the eutectic system selected. Suitable substrate materials are, for example, Pyrex® glass microscope slides, alumina, mica, and silicon. The effects of thermal conductivity are discussed below.

The geometry of the substrate will primarily be determined by the ultimate use of the thin film eutectic solidified thereon, but will at least be characterized by having top 2 and bottom 3 major opposed substantially parallel surfaces and an outer peripheral edge area 4 interconnecting the major surfaces. Smoothness of substrate surface 2, which will contact the eutectic thin film, is a factor as asperities in the surface 2 will disrupt the solidification process and produce faults or other defects. Preferably, surface 2 should be smooth to within at least about one-tenth of the film thickness. Also, based on heat flow considerations, the surface 3 opposite surface 2 should be flat and substantially parallel to surface 2.

Next, the thicknesses of the materials, i.e., components, of the eutectic system are calculated, per unit area of substrate, as a ratio according to the following formula:

$$t_1\rho_1W_1 = t_2\rho_2W_2 = \ldots = t_n\rho_nW_n \tag{1}$$

where $W_1$ = weight percent of component 1 in the eutectic
$W_n$ = weight percent of the $n^{th}$ component in the eutectic
$\rho_1$ = density of component 1
$\rho_n$ = density of the $n^{th}$ component
$t_1$ = thickness of the layer of component 1
$t_n$ = thickness of the layer of the $n^{th}$ component and converted to actual thicknesses by use of the formula:

$$t_{film} = t_{total} = t_1 + t_2 + \ldots + t_n \tag{2}$$

For a binary system, equation (1) reduces to $$\frac{t_1}{t_2} = \frac{\rho_2 W_1}{\rho_1(1 - W_1)} \tag{3}$$

The calculational method shown above is more accurate than calculations from the phase diagram based on the so-called lever rule and is, therefore, preferred.

The starting materials should be as pure as possible, preferably "4-9s" or purer, as impurities tend to disrupt the heat and mass balances of the solidifying eutectic thereby forming defects, e.g., faults. Contamination of the substrate and the materials of the eutectic is to be avoided. The practice of clean room conditions, such as are known to those skilled in the art of the manufacture of semiconductor devices, is preferable.

The eutectic materials and the substrate are transferred to suitable apparatus (not shown) for the evaporation and deposition of the materials onto substrate 1. In a vacuum, preferably less than or equal to $10^{-6}$ torr, the materials of the eutectic are evaporated and deposited sequentially in overlying planar layer-like fashion onto the substrate. In FIG. 1 there is shown schematically a first component layer 5 of a binary eutectic system deposited upon substrate 1 and the second component layer 6 deposited upon layer 5. Preferably, the thickness of each layer is within ±10% of that calculated with Equations (1) and (b 2), although for some eutectic systems the acceptable tolerance may be less than ±10%.

Optionally, a cover layer 7, as shown in FIG. 1, may be provided on top of the deposited eutectic components. The material property requirements of cover layer 7 are the same as those of substrate 1. The cover layer 7 may be provided by depositing a refractory metal oxide subsequent to the deposition of the layers of the eutectic material or may be another piece of the same material as substrate 1 laid upon the deposited composite. The cover layer 7 is desirable to prevent oxidation of the eutectic during subsequent processing. Oxidation may also be avoided by practicing the invention in a vacuum or inert atmosphere. With or without cover layer 7, a completed preform 10 has been fabricated at this stage.

Figure 2A:
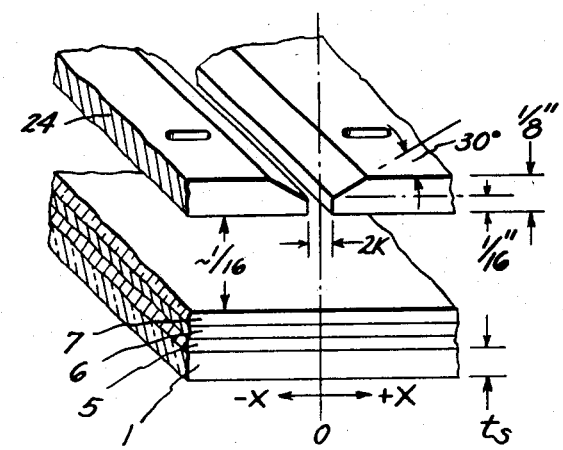
FIG. 2A is an enlarged perspective representation of the shutters used to vary the spatial power distribution of the line source of heat shown in FIG. 2.
Figure 2:
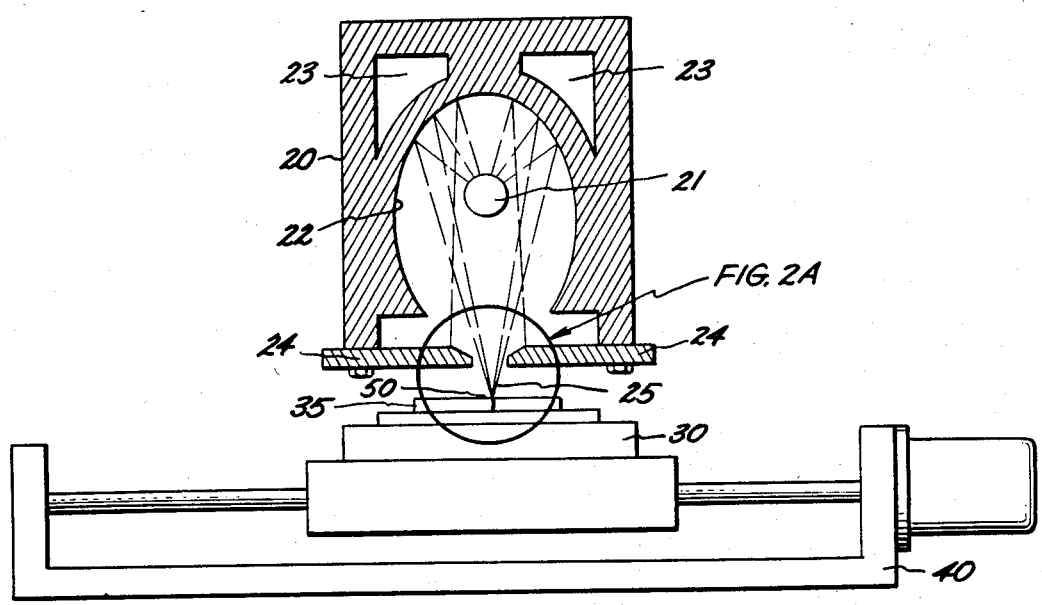
FIG. 2 is a schematic side view in cross section illustrating one apparatus used for the production of thin film eutectics in accordance with the present invention.
Figure 3:
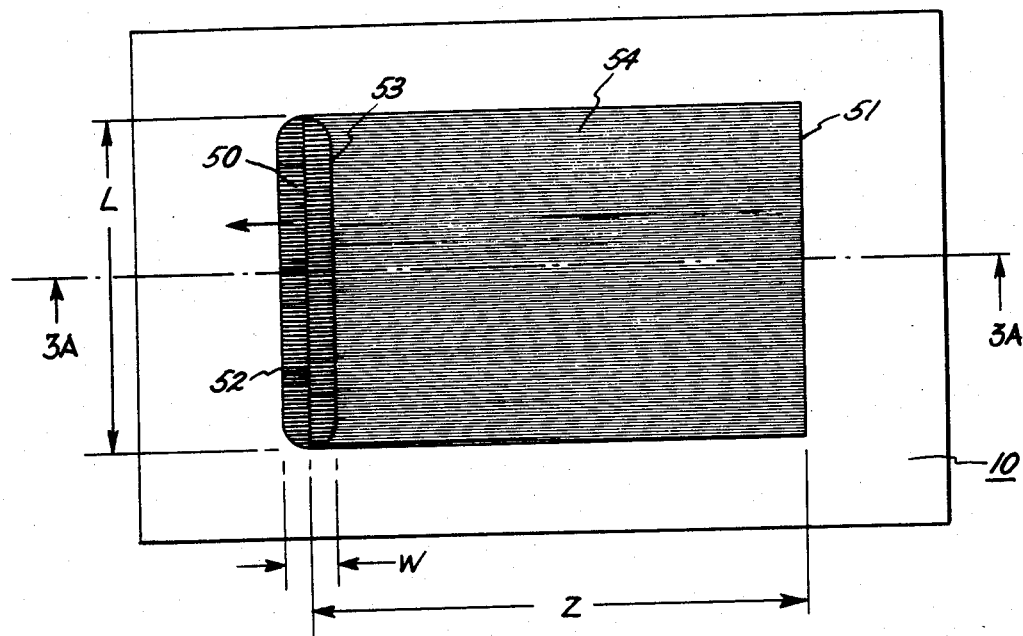
FIG. 3 is a schematic representation of the top surface of a preform partly converted to a eutectic thin film in accordance with the method of this invention.

The prepared eutectic preform 10 is next placed in an apparatus, such as that shown schematically in FIG. 2, for the next steps in the preparation of the eutectic thin film. The apparatus of FIG. 2 consists of at least a heat source 20 capable of projecting a beam of heat 25 onto preform 10, a heat sink 30 and means 40 for smoothly translating the heat sink 30 and preform 10 mounted thereon beneath heat source 20 at a determinable uniform rate. Sufficient heat is applied from heat source 20 to form a narrow zone 50 of width W and longitudinally extending length L, as shown in FIG. 2 and in FIGS. 3 and 3A in more detail. FIG. 3 is, in part, a schematic representation of the top surface of a preform partly converted to a eutectic thin film in accordance with the method of this invention.

Figure 3A:
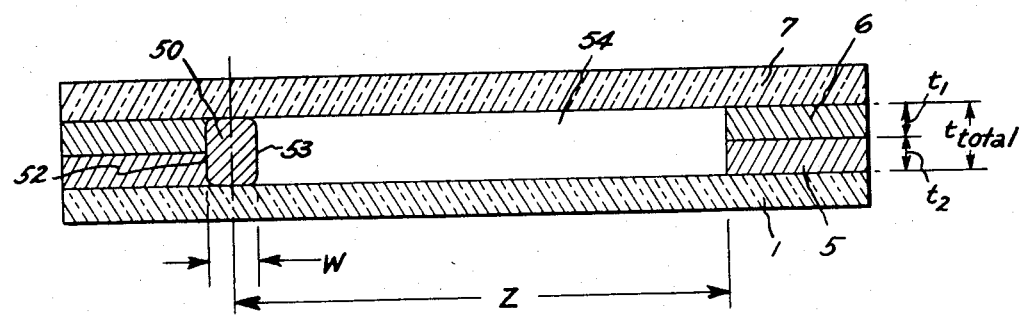
FIG. 3A is a schematic cross section of the thin film eutectic of FIG. 3 taken along line 3A—3A.

As shown in FIG. 3A, molten zone 50 will be coextensive with at least a portion of the substrate 1 and cover layer 7, if cover layer 7 is present. If cover layer 7 is not present, molten zone 50 will rest on at least a portion of substrate 1 and will be otherwise bounded by the unmelted eutectic material layers 5 and 6 of preform 10. By operating means 40, preform 10 is transversed beneath the stationary heat source thereby, in effect, moving molten zone 50 across preform 10. As molten zone 50 traverses preform 10, the components 5 and 6 of the eutectic are melted at the leading edge 52 of zone 50, mixed together in zone 50, and solidified at the trailing edge 53 of zone 50 in the desired eutectic pattern 54. After the desired amount of material has been melted and solidified, the traversing motion of means 40 is stopped and heat source 20 is turned off whereupon molten zone 50 freezes in situ. In FIGS. 3 and 3A, molten zone 50 is shown after traversing a distance Z, in the direction of the arrow, from starting location 51.

Figure 4:
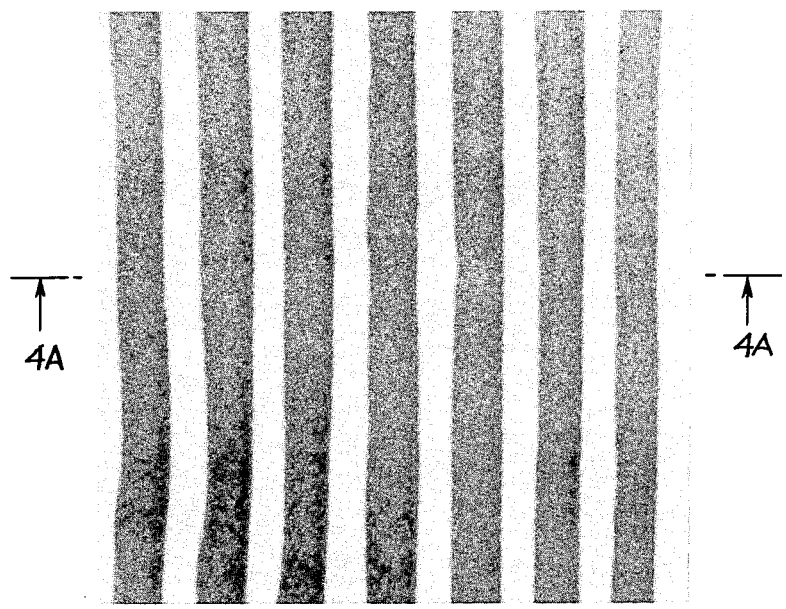
FIG. 4 is a scanning electron micrograph at 7000× of a 4-micron thick Pb-Sn eutectic film solidified at $2 \times 10^{-3}$ cm/sec. The interlamellar spacing is 1.8 microns, the lighter Pb-rich phase is 0.72 microns wide, and the darker Sn-rich phase is 1.08 microns wide.

FIG. 4 is an electron photomicrograph at 7000× of a typical two phase thin film lamellar eutectic made by the method of this invention, e.g., schematic region 54 of FIG. 3 rotated through an angle of 90°. The interlamellar spacing, λ, defined as the distance between the center of one lamella to the center of the nearest adjacent lamella of the same type, is shown in FIG. 4. Those skilled in the metallurgical arts will understand that the compositions of the lamellae, denoted as 55 and 56 in FIG. 4, will be at or below the terminal solid solutions of the respective phases of the alloy system.

Figure 4A:
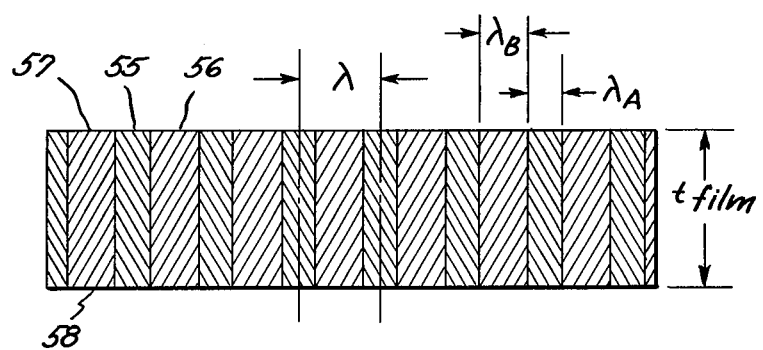
FIG. 4A is a schematic view in cross section of the thin film eutectic of FIG. 4 taken along line 4A—4A.

The spatial arrangement of the lamellae of the eutectic film of FIG. 4 is shown in more detail in FIG. 4A which is a cross-sectional schematic view taken along line 4A—4A of FIG. 4. On FIG. 4A there is shown the interlamellar spacing, the widths $\lambda_A$ and $\lambda_B$ of lamella 55 and 56, respectively, and the resultant film thickness, $t_{film}$.

Generally, the thickness of the resultant film is equal to the sum of the thicknesses of the component layers. A desirable feature of the method of this invention, compared to such prior art methods as melt extraction, is that large areas of thin film, e.g., 2 inches square, but without practical limitation thereon, having a uniform thickness throughout can be reproducibly produced. Additionally, as will be described below in more detail, the interlamellar spacing and film thickness can be independently selected.

The lamellae extend between and terminate in the substantially parallel and generally planar top 57 and bottom 58 surfaces of the thin film. A general and desirable characteristic of the lamellar eutectics produced by the method of this invention is that the center lines of the lamellae, when viewed in cross section, are substantially parallel to the thickness dimension, i.e., the lamellae intersect the top 57 and bottom 58 surfaces of the thin film at substantially right angles. This desirable features makes the thin film eutectics of this invention useful as diffraction gratings in general and, as disclosed in the above-referenced Ser. No. 253,985 application, particularly useful as masks for X-ray lithography.

As used herein, the term "fault-free" means an absence of lamellae terminations, or branches, over the primary region of interest which encompasses a region at least 100 lamellae square. Also, the term "cell-free" implies a structure produced by a planar solid-liquid interface resulting in substantially parallel alignment of the lamellae of a lamellar eutectic over the entire area of the solidified thin film which typically measured, but is not limited to, an area 2 inches square.

The interlamellar spacing is a function of the growth, i.e., solidification, rate and generally follows the empirical relationship $$\lambda^2 V = \text{constant} \tag{4}$$

where V equals the growth rate. Generally, the growth rate is equal to the rate at which molten zone 50 is traversed across preform 10. In the case of the Pb-Sn eutectic system, the constant has been found [Cline and Livingston, Trans. TMS-AIME, 245, 1987 (1969)] to be equal to about $3.8 \times 10^{-11}$ cm³/sec for solidification in bulk, i.e., thick, sections. The thin films of this invention generally followed the $\lambda^2 V$ relationship. The mean value of the constant ($5.4 \times 10^{-11}$ cm³/sec) for the Pb-Sn thin films produced by the method of this invention was comparable to that for the bulk, however, there was considerable scatter about the mean which is indicative of an increased sensitivity of the thin film eutectics to local thermal conditions compared to eutectics solidified in bulk.

Several factors govern the selection of substrate 1 and heat sink 30. The thermal conductivity of heat sink 30 must be greater than that of substrate 1. Enough heat must be supplied to melt the eutectic components deposited on substrate 1. However, if too much heat is supplied, or not dissipated rapidly enough, the melted eutectic will tend to coagulate and form small droplets of the liquid metal. Routine experimentation may be required to strike the proper balance between the heat supplied and removed in relation to the materials of the eutectic system, substrate 1 and heat sink 30.

Substrate 1 must make good uniform contact with heat sink 30 or there will be non-uniformity of the heat flow pattern and a non-uniform, e.g., faulted, thin film eutectic may result. To promote heat transfer and establishment of a steep thermal gradient, $G_L$, in molten zone 50, heat sink 30 is preferably equipped with means, such as internal passageways, for circulation of a suitable cooling fluid. Copper is a highly desirable material for heat sink 30 and its effectiveness may be enhanced by proper preparation of the surface closest to the preform 10 such as by dressing with a fly cutter. Overall uniformity of heat transfer may also be enhanced by placing a flat quartz plate 35 between heat sink 30 and preform 10.

The thermal gradient in the liquid, $G_L$, and the growth, or solidification rate R, interact to determine the quality of eutectic formed. For example, for a lamellar eutectic, increased values of $G_L/R$ will ensure that a cell-free lamellar, i.e., parallel plate, alignment is maintained over extensive distances. Increased values of $G_L$ permit increased values of R which, in turn, yield decreases in the interlamellar spacing. The thermal gradient $G_L$ is primarily a function of the spatial distribution of heat from source 20 and the thermal characteristics of the system consisting of the materials of the eutectic, substrate 1 and heat sink 30.

A line heater, such as that shown in FIG. 2, has been found to be an effective heat source 20 with suitable modifications including a line voltage regulator to minimize power fluctuations. One such line heater is that manufactured by Research, Inc. of Minneapolis, Minnesota (Catalogue #5215-10). The line heater of FIG. 2 consists primarily of a lamp 21 situate at the focal point of an aluminum elliptical reflector 22 which has cooling channels 23 therein. It has been found that a quartz lamp is an effective heat source 21.

Figure 5A:
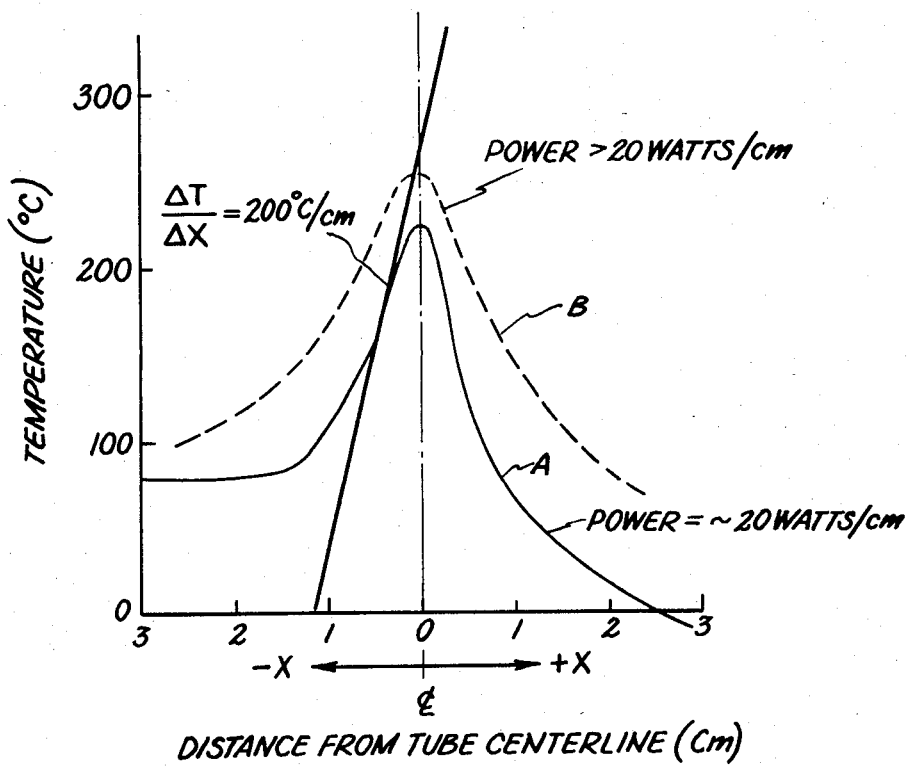
FIG. 5 shows the spatial temperature distribution beneath an unmodified line heater at a power level of about 20 watts/cm with the graphical calculation of the theoretical thermal gradient imposed thereon. Also shown is the effect of increased power level on the shape of the spatial temperature distribution.
FIG. 5B shows the spatial temperature distribution beneath a line heater modified by shutters having a 3 mm gap between the shutters with the graphical calculation of the theoretical thermal gradient imposed thereon.

It was determined during the course of the making of this invention that the unmodified commercial line heater produced a lower than desirable thermal gradient within molten zone 50. FIG. 5A shows (curve A) the thermal profile beneath an unmodified line heater 20 equipped with a quartz lamp. The temperature profile of FIG. 5A was measured with a 0.01 cm. diameter thermocouple cemented to a Pyrex ® slide to simulate the thermal environment of the film. The typical thermal profile, i.e., spatial power distribution, of FIG. 5A, produced a simulated thermal gradient of about 200° C./cm. at the melting point (183° C.) of the lead-tin eutectic at an applied power of approximately 20 watts/cm. The distribution of FIG. 5A actually resulted in a 0.3 cm. wide melt zone 50 in a 4 micron thick lead-tin thin film eutectic at a solidification (growth) rate of $4 \times 10^{-3}$ cm/sec. Changes in power level will affect the gradient. Increased power, for example, will raise the peak temperature and broaden the distribution, as shown by the dashed lines (curve B) on FIG. 5A; the net effect of which will be to decrease the gradient. For thin lead-tin eutectic films, e.g., those less than or equal to about 8 microns in thickness, the temperature distribution was found to be primarily a function of the type and thickness of the substrate material and independent of the eutectic film thickness.

The thermal gradient was improved during the course of the making of this invention by placing adjustable shutters 24 between line heater 20 and preform 10 as shown in FIGS. 2 and 2A. The best material for shutters 24 was found to be highly polished aluminum. The gap, 2K, between the shutters is primarily a function of the thickness, $t_s$, and material of substrate 1 and the power, i.e., heat intensity, of lamp 21 and is readily determined by trial and error. The power and gap are adjusted to provide sufficient heat to melt the eutectic components with the narrowest thermal profile.

Figure 5B:
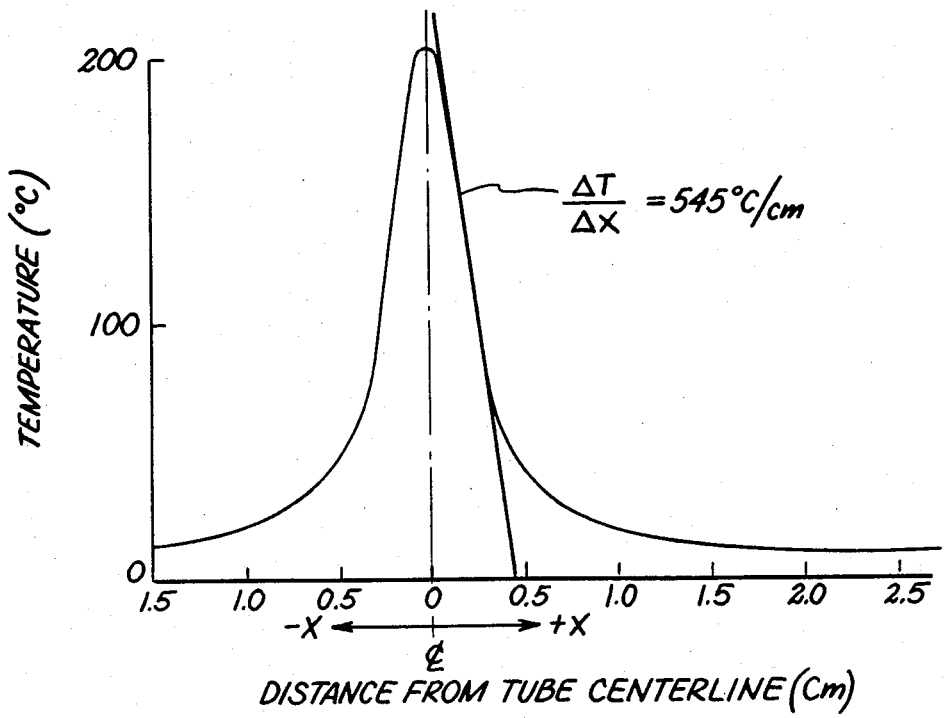

In FIG. 5B there is shown the simulated thermal gradient (525° C./cm) made possible by use of shutters 24 having a gap, 2K or 3 mm. at a power level of 500 watts. The simulated thermal profile of FIG. 5B was made in the same manner as that of curve A of FIG. 5A. The simulated thermal profile of FIG. 5B actually resulted in a 0.2 cm. wide molten zone 50 in a 2 micron thick lead-tin thin film eutectic at a solidification (growth) rate of $4 \times 10^{-3}$ cm/sec. Increased temperatures may be produced by the use of heat sources such as arc lamps which provide more heat than those of the quartz lamp.

A laser is also a suitable, although more expensive, heat source 20 than the line heater. The narrower molten zone 50 created by a laser makes possible higher thermal gradients in the molten zone 50 and, consequently, eutectics with thinner lamellae and narrower interlamellar spacings. Replacement of the line heater with a laser as heat source 20 requires means for spreading the beam into a line heat source. The use of optics to slowly scan or raster the laser beam across preform 10 has been found to result in objectionable surface perturbations. A simple non-mechanical solution is to provide a cylindrical lens in the path of the laser beam between the laser as heat source 20 and the preform 10 to convert the circular beam into a thin line source of heat. It has been found, however, that the beam intensity was not uniform along the length of the line when the lens system was used, i.e., there was a decrease in power at the ends compared to the center of the line of heat.

Figure 6:
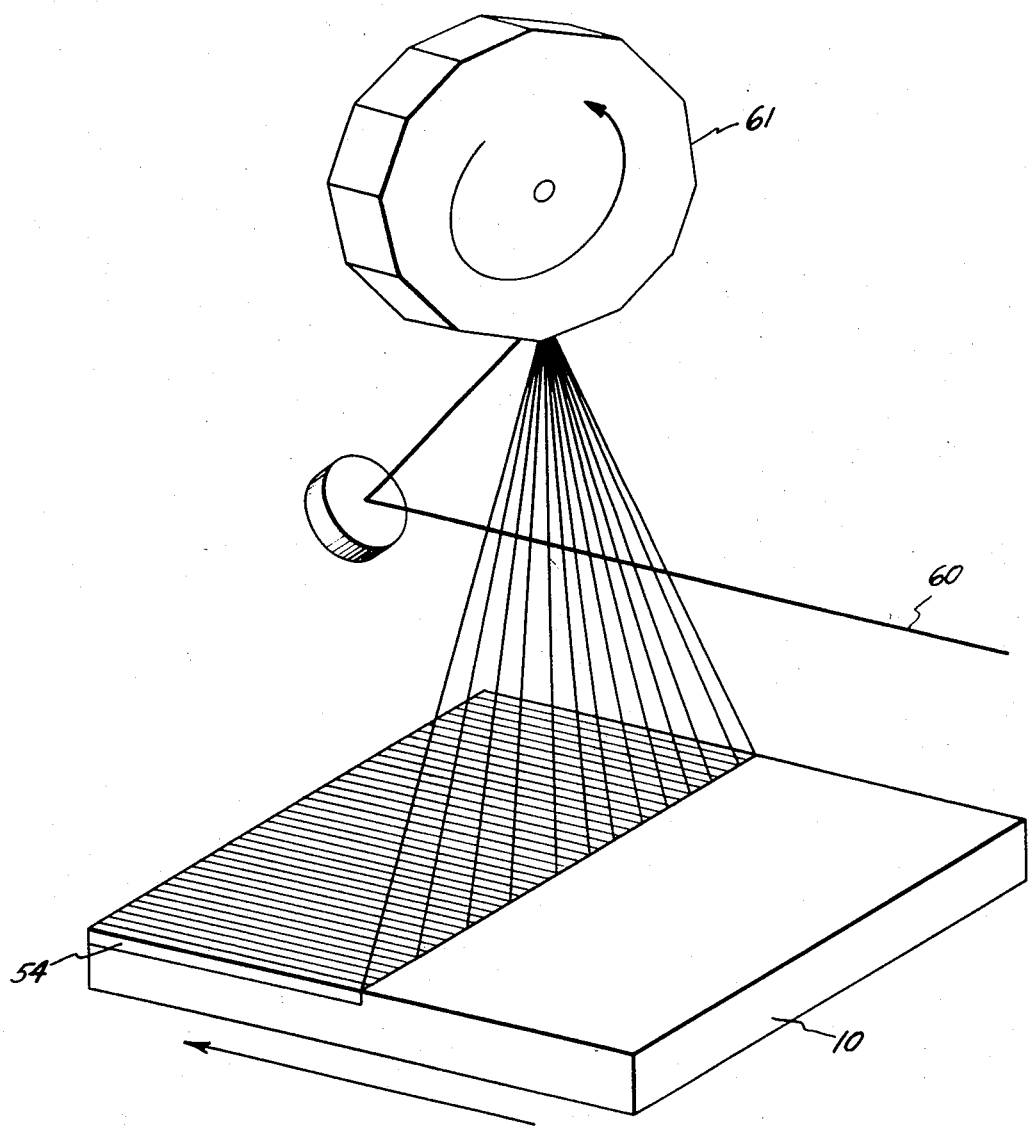
FIG. 6 is a schematic perspective drawing of the generation of a line source of heat using a rotating polygonal mirror and a laser beam.

The laser beam 60 may be scanned rapidly enough through the use of a lens-mirror system, such as the rotating polygonal mirror 61 shown in FIG. 6, to create a line source of heat. A further advantage of the use of a laser as heat source 20 is that preform 10 may be kept stationary and molten zone 50 traversed across preform 10 by the use of additional optical scanning means. By keeping the preform 10 stationary, it is possible to minimize disruption of the structure by external mechanical vibrations. The use of the rotating mirror, however, adds to the overall cost of the system and requires that the optical system be kept in perfect alignment.

EXAMPLE I

Figure 7:
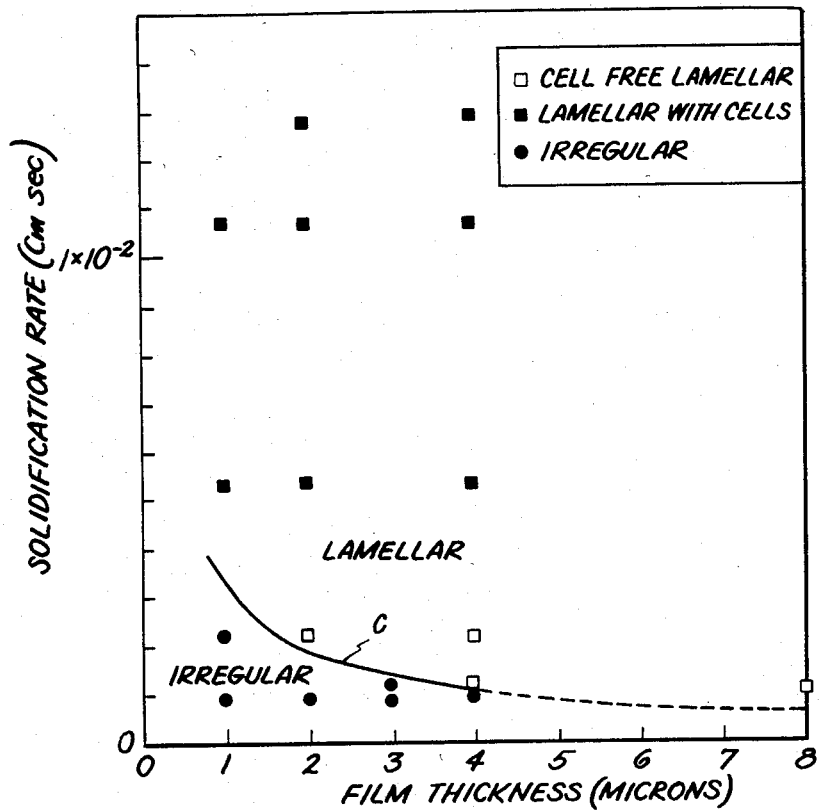
FIG. 7 is a graph of film thickness versus solidification rate showing the conditions under which a lamellar structure will be formed.

A systematic investigation of the stability of the lamellar structure at different film thicknesses and solidification rates was conducted and the results are shown in FIG. 7. Thin films of Pb and Sn were sequentially deposited on Pyrex ® microscope slides in an electron beam evaporator. Evaporation was performed in a vacuum of $10^{-6}$ torr from sources of 99.999 percent pure material. First the Pb film was deposited on the freshly cleaned glass slide and then, without breaking vacuum, the Sn film was deposited on top of the Pb layer. The total film thickness was varied between one and 8 microns to study the effect of film thickness at the eutectic composition. The film thicknesses were calculated in accordance with equations (1) and (2), and, in all cases, the Pb film was 28% of the total film thickness. A second Pyrex ® microscope slide (similar to the substrate) was used to cover the film and protect it from oxidation during the solidification process.

The samples were individually directionally solidified at the rates shown on FIG. 7 utilizing a line heater as shown in FIG. 2. A quartz-iodine lamp located at one focus of an elliptical reflector produced a line source of heat about 0.3 cm. wide, and longitudinally extending about 5 cm, at the surface of the film after passing through a shuttered gap 0.3 cm. wide. Each glass slide was individually placed on a quartz plate that rested on a flat water-cooled copper heat sink. Thermal contact between the quartz plate and the copper heat sink was increased a factor of two by machining the surface of the copper flat with a fly cutter.

Figure 8:
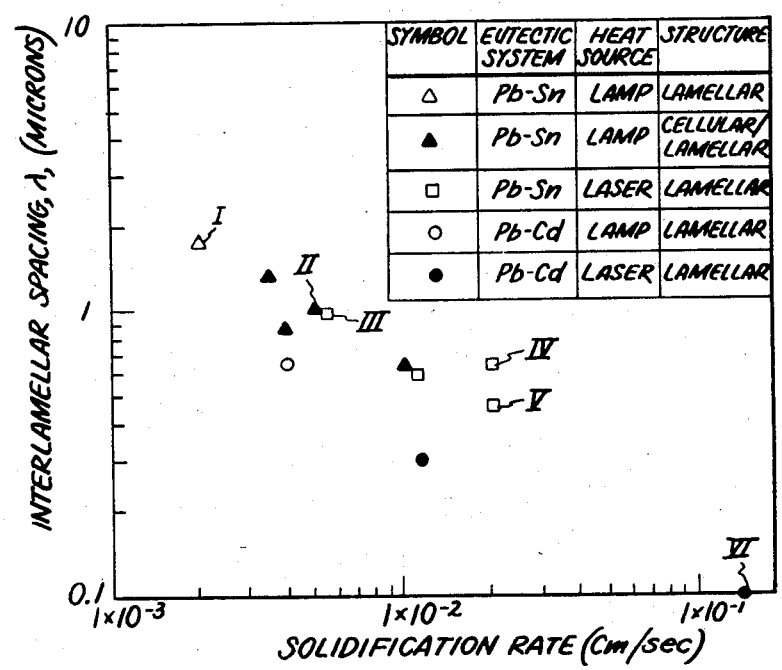
FIG. 8 is a graph of interlamellar spacing versus solidification rate for several lead-tin and lead-cadmium thin film eutectics made with either a quartz lamp or laser beam heat source in accordance with the method of this invention.

After solidification, the covering glass slide was readily removed as it did not stick to the thin film eutectic. The interlamellar spacings, $\lambda$, and widths of the individual lamella were measured by means of optical and scanning electron microscopy. Since the tin- and lead-rich phases, i.e., the alternate lamellae, have a different reflectivity, the phases may be distinguished without any metallographic preparation of the surface. Contrast was improved using polarized light, since tin is optically active. A scanning electron microscope was used to reveal the structure with higher resolution than was possible with light microscopy. A typical scanning electron micrograph is that of FIG. 4 at 7000× wherein the darker tin-rich phase is 1.08 microns wide, the lighter lead-rich phase is 0.72 microns wide and the interlamellar spacing is about 1.8 microns. The structure of FIG. 4 is also represented by data point I on FIG. 8 which is a graph of interlamellar spacing versus solidification rate. In the scanning electron microscope the lead-rich phase appears lighter than the tin-rich phase which was opposite to that of light microscopy, where the lead-rich phase was darker.

The structure of the Pb-Sn eutectic film was a function of the film thickness and growth rate as shown in FIG. 7. Above a critical combination of film thickness and growth rate, curve C of FIG. 7, the structure was lamellar and below the critical combination the structure was observed to be irregular.

EXAMPLE II

Figure 9:
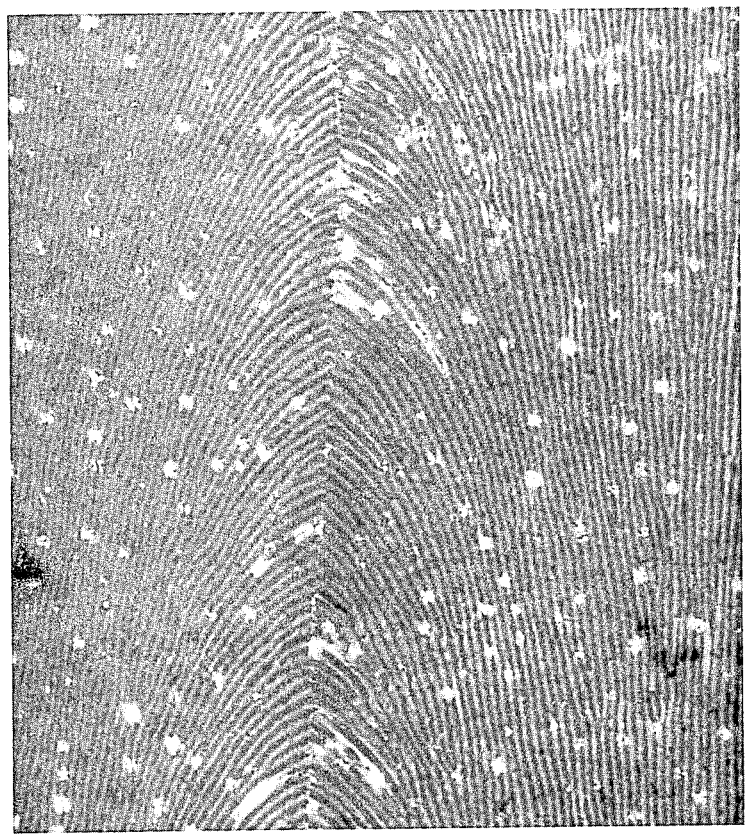
FIG. 9 is a photomicrograph at 1000× of a 2 micron thick Pb-Sn eutectic film solidified at $5 \times 10^{-2}$ cm/sec showing the formation of cell boundaries.

Using the same general procedure described in Example I, a thin film 2 microns thick of lead-tin eutectic was made. The solidification rate was, however, increased to $5 \times 10^{-2}$ cm/sec. The structure formed is shown in FIG. 9 and the specimen is identified as data point II on FIG. 8. The curvature of the lamellae observable in FIG. 9 is due to a departure from a planar liquid-solid solidification interface due to the increase in solidification rate over that of Example I. In areas away from the curved plates at the cell walls the lamellae are parallel and have an interlamellar spacing of about 1.05 microns.

EXAMPLE III

Using the same general procedure as described in Example I, a 2 micron thick lead-tin eutectic was produced by the method of this invention using a laser heat source. The laser employed was a Quantronix Model 117 Nd:YAG 90 watt (maximum) continuous power laser. The circular laser beam was converted and focused into a line heat source by placing a cylindrical lens with a 50 mm. focal length in the path of the beam. A 200 micron wide molten zone about 4 mm in length was established and moved with a velocity of $5.4 \times 10^{-3}$ cm/sec. A fault-free and cell-free eutectic with an interlamellar spacing of 1.0 micron was formed. This example is indicated as point III on FIG. 8. The structure of this eutectic did not exhibit the curvature and cell walls exhibited by the eutectic of Example II. The lack of curvature is attributed to the higher thermal gradient, $G_L$, in the molten zone, and concomitant planar solidification interface, which resulted from the narrower line source of heat produced by the laser compared to that produced by the line heater of Example II.

EXAMPLE IV

Using the same method described in Example III another lead-tin eutectic was solidified at a rate of $2 \times 10^{-2}$ cm/sec. The resulting cell-free structure had interlamellar spacings between 0.45 and 0.65 microns depending upon the area of the film examined. This variation in interlamellar spacing was due to local variations of the laser power. The data points of this example are identified as points IV and V on FIG. 8. Again, the cell-free structure was due to the higher thermal gradient that resulted from the use of the laser as the heat source compared to the thermal gradient produced by the line heater.

EXAMPLE V

Using the same method as Example IV a lead-cadmium thin film eutectic 2 microns thick was solidified at a rate of $1.45 \times 10^{-1}$ cm/sec. The interlamellar spacing was near the limit of resolution of the scanning electron microscope but was measured to be 0.1 micron. The width of the cadmium-rich phase was below the resolution limit of the scanning electron microscope, but was calculated at 0.025 microns from the phase diagram. The lead-cadmium eutectic system is expected to be more amenable to processing as a thin film by the method of this invention since, in contrast to the lead-tin system, there is a preferred crystallographic relationship between the lamellar phases. The width of the lead phase is about ⅜ of the width of the tin phase in the lead-tin eutectic and about three times the width of the cadmium phase in the lead-cadmium eutectic. The Pb-Cd eutectic of this Example is denoted by data point VI on FIG. 8.

While the invention has been particularly shown and described with reference to several preferred embodiments thereof, it will be understood by those skilled in the art that various changes in form and detail may be made therein without departing from the true spirit and scope of the invention as defined by the appended claims.

I claim:

1. A method for making eutectics as thin films comprising the steps of:

(a) depositing sequentially the components of the eutectic system at a purity level of at least 99.99% as overlying thin planar layers on at least a portion of a substrate, said substrate having top and bottom major opposed substantially parallel surfaces and an outer peripheral edge area interconnecting said major surfaces and being of a material which is substantially inert relative to said eutectic system, forming thereby a preform;

(b) creating a longitudinally extending molten zone of said components by impinging on said preform a beam of heat from a quartz lamp heat source within a line heater, said molten zone extending through said planar layers and being contiguous with at least a portion of said top major surface of said substrate; and (c) moving said molten zone across at least a portion of said preform melting thereby the components of said eutectic alloy at the leading edge of said zone, mixing said components in said zone, and freezing said components at the trailing edge of said zone, forming thereby a eutectic thin film of the eutectic composition of said components.

2. The method of claim 1 wherein the material of said substrate is one selected from the group consisting of glass, mica, silicon, and alumina.

3. The method of claim 1 wherein said top surface of said substrate is smooth to within at least about one-tenth of the thickness of the sum of the thicknesses of said planar layers.

4. The method of claim 1 wherein said molten zone is moved across said preform by means of an optical system.

* * * * *